United States Patent
Morisaki

(10) Patent No.: US 6,236,586 B1
(45) Date of Patent: *May 22, 2001

(54) MICRO MAGNETIC CORE MEMORY

(76) Inventor: Masayuki Morisaki, 6008-1 Natsuo-cho, Miyakonojou-shi, Miyazaki-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,812

(22) Filed: Apr. 8, 1998

(30) Foreign Application Priority Data

Apr. 9, 1997 (JP) .................................................... 9-126204

(51) Int. Cl.$^7$ .................................................... G11C 21/00
(52) U.S. Cl. ................................ 365/74; 365/66; 365/171
(58) Field of Search ............................... 365/74, 66, 171, 365/55, 33, 225.5, 50

(56) References Cited

U.S. PATENT DOCUMENTS

| | | | |
|---|---|---|---|
| 2,710,952 | * 6/1955 | Steagall | 365/74 X |
| 2,814,793 | * 11/1957 | Bonn | 365/74 X |
| 3,003,141 | * 10/1961 | Myers, Jr. | 365/74 |
| 3,248,716 | * 4/1966 | Snyder | 365/74 X |
| 3,397,394 | * 8/1968 | Maeda | 365/66 X |
| 3,440,719 | * 4/1969 | Meier | 365/55 X |
| 3,582,919 | * 6/1971 | Ezaki | 365/66 X |
| 3,602,906 | * 8/1971 | Wiegand | 340/174 |
| 3,670,312 | * 6/1972 | Broadbent | 340/174 |
| 5,237,529 | * 8/1993 | Spitzer | 365/151 X |
| 5,592,413 | * 1/1997 | Spitzer | 365/151 |

* cited by examiner

*Primary Examiner*—A. Zarabian
(74) *Attorney, Agent, or Firm*—Nixon Peabody, LLP; Donald R. Studebaker

(57) ABSTRACT

A micro magnetic core memory having a magnetic core, which serves as a storage medium, a coil, which is located in close vicinity to the magnetic core and magnetizes the magnetic core, and a sensor, which is located in close vicinity to the magnetic core and detects polarity of magnetization of the magnetic core. The micro magnetic core memory has the effects in that the inputting and the outputting of information can be carried out quickly, in that a high degree of integration can be achieved easily and a storage device having a large capacity can be produced at a low cost, and in that the stored information is not lost when the supply of electric power is turned off.

12 Claims, 4 Drawing Sheets

NOTE:
○ MAGNETIC CORES 1a~1n(S POLARITY)
⊘ MAGNETIC CORES 1a~1n(N POLARITY)
⊥ SENSORS 2a~2n
⊤ COILS 3a~3n
| READING ROW LINES 21a~21n
— READING COLUMN LINES 22a~22n
‖ WRITING ROW LINES 31a~31n
= WRITING COLUMN LINES 32a~32n

F I G . 1
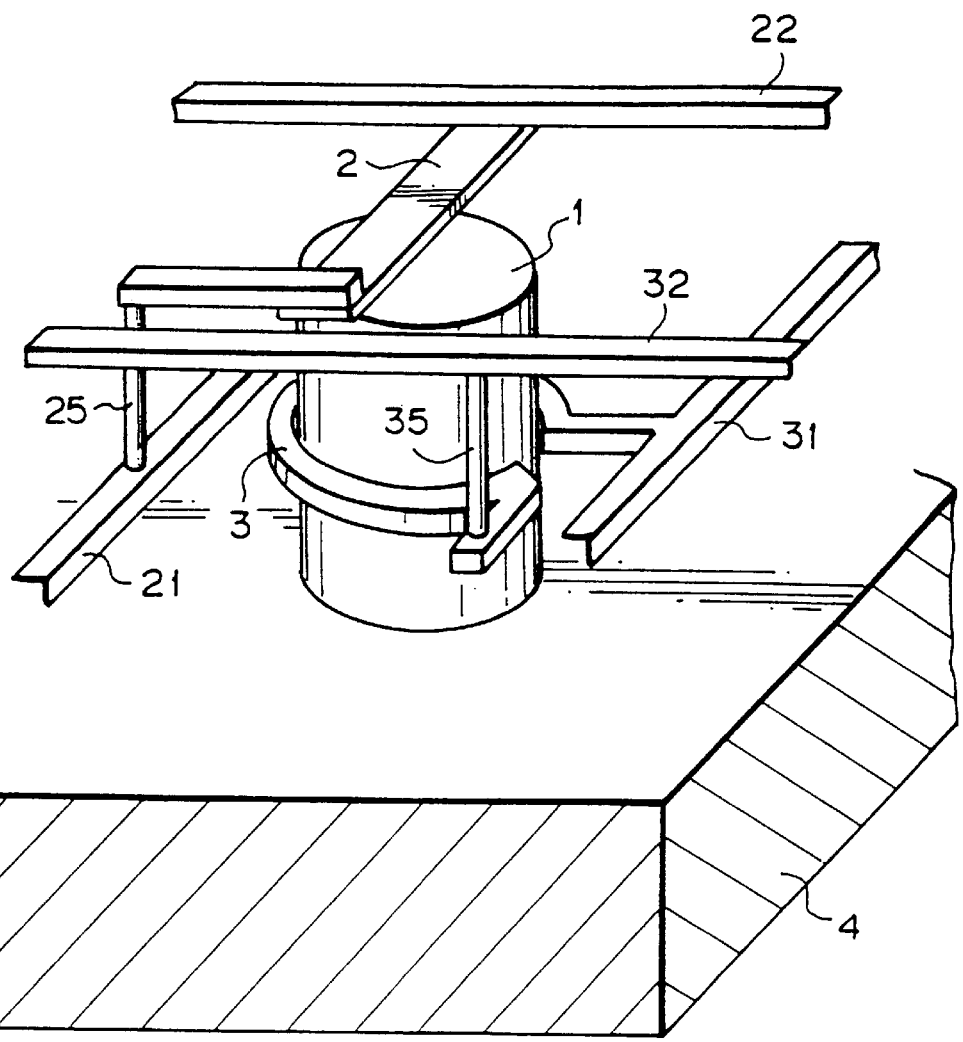

NOTE:

○ MAGNETIC CORES 1a~1n (S POLARITY)

◉ MAGNETIC CORES 1a~1n (N POLARITY)

SENSORS 2a~2n

COILS 3a~3n

| READING ROW LINES 21a~21n

— READING COLUMN LINES 22a~22n

‖ WRITING ROW LINES 31a~31n

= WRITING COLUMN LINES 32a~32n

☒ : FIRST-LAYER METAL
☐ : SECOND-LAYER METAL

MICRO MAGNETIC CORE MEMORY

BACKGROUND OF THE INVENTION

1. Field of the Invention

This invention relates to a memory cell, which is formed on a semiconductor substrate constituted of silicon, or the like. This invention also relates to a method of inputting and outputting information.

2. Description of the Prior Art

With the increased use of the Internet in recent years, there has arisen a strong demand for computers, particularly personal computers (hereinbelow referred to as the "PC"), and rapid advances have been made in the related techniques. Also, the market requires products, which have as high a performance as possible and are as cheap as possible, and research has continuously been carried out in order to satisfy the requirements of the market.

One of important factors for determining the performance of computers is a storage device. Currently popular storage devices are semiconductor storage devices, which comprise a semiconductor substrate constituted of silicon, or the like, and memory cells formed on the semiconductor substrate. In order for a storage device to have a high performance, the storage device should primarily satisfy the requirements in that the inputting and the outputting of information can be carried out quickly, in that the memory should have a large capacity, and in that the stored information can be retained with a high stability. It will be possible for computers to take constitutions in accordance with various requirements of the market. However, if both of the requirements for the quick operation and the large capacity are to be satisfied, the cost cannot be kept low. The cost can be kept low by compromising on either one of the two requirements.

In the currently most popular main body memories of PC's, cache memories and main memories are constituted of random access memories (RAM's). As the RAM's, dynamic random access memories (DRAM's) and static random access memories (SRAM's) are used.

The DRAM's have a larger capacity per unit area than SRAM's and can be produced at a low cost. However, the DRAM's have the drawbacks in that, since the takeout of stored information is carried out by the discharging of electric charges, a long time is required to output the stored information, and electric charges must always be supplied (refreshed). With the SRAM's, the takeout of stored information is carried out by the discrimination of the state of a multivibrator. Therefore, with the SRAM's, refreshing operations need not be carried out, and the stored information can be read quickly. However, the SRAM's have the drawbacks in that, due to their complicated structures, the capacity per unit area is smaller than in the DRAM's, and the cost cannot be kept low.

Accordingly, in an ordinary constitution of PC memories, the SRAM's are employed as the cache memories, the DRAM's are employed as the main memories, and the cost is thereby restricted.

Also, with the DRAM's and the SRAM's, the stored information is lost when the electric power source is turned off, and therefore necessary information must be stored on other storage devices, such as disks. Memories, which have the characteristics such that the stored information may not be lost when the electric power source is turned off, include flash memories. However, due to the necessity of a high voltage for the information inputting operation, a limitation on the capacity, and the cost, the flash memories cannot sufficiently satisfy the aforesaid requirements of the current market.

SUMMARY OF THE INVENTION

The primary object of the present invention is to provide a micro magnetic core memory, which serves as a memory cell constituting a storage device capable of satisfying requirements for a main body RAM of a computer in that the inputting and the outputting of information can be carried out quickly, in that a high degree of integration can be achieved easily and a storage device having a large capacity can be produced at a low cost, and in that the stored information can be retained with a high stability without being lost when the supply of electric power is turned off.

Another object of the present invention is to provide a method of inputting and outputting information, in which the micro magnetic core memory is utilized.

The present invention provides a micro magnetic core memory, comprising:

i) a magnetic core, which serves as a storage medium, ii) a coil, which is located in close vicinity to the magnetic core and magnetizes the magnetic core, and iii) a sensor, which is located in close vicinity to the magnetic core and detects polarity of magnetization of the magnetic core.

The present invention also provides a method of inputting and outputting information, comprising the steps of:

i) employing a magnetic core, which is a magnetic material, as a storage medium, ii) locating at least one coil with respect to one magnetic core, the coil serving to magnetize the magnetic core, iii) magnetizing the magnetic core by the coil, information being thereby written into the magnetic core, iv) locating at least one sensor with respect to one magnetic core, the sensor serving to detect polarity of magnetization of the magnetic core, and v) detecting the polarity of magnetization of the magnetic core by the sensor, the stored information being thereby read from the magnetic core.

The micro magnetic core memory in accordance with the present invention serves as a memory cell for constituting a storage device, which takes on the form of an RAM primarily like a DRAM and a SRAM. The micro magnetic core memory in accordance with the present invention has the same advantages as those of the DRAM and the SRAM. Also, with the micro magnetic core memory in accordance with the present invention, as in a flash memory, the stored information is not lost when the electric power source is turned off.

Therefore, in the method of inputting and outputting information, the magnetic core is employed as a storage medium, at least one coil is located with respect to one magnetic core, the magnetic core is magnetized by the coil, and information is thereby written into the magnetic core. Further, at least one sensor is located with respect to one magnetic core, the polarity of magnetization of the magnetic core is detected by the sensor, and the stored information is thereby read from the magnetic core.

In a fundamental constitution of the memory cell, the coil may be wound around the magnetic core, and the sensor may be located in close vicinity to the magnetic core. As the sensor, a thin-film sensor, such as a giant magnetic resistor (GMR) or a magnetic resistor (MR), which is easy to process and has a high resolution, may be employed.

Accordingly, the micro magnetic core memory in accordance with the present invention has the simple structure and does not require complicated structures, such as trenches and stacks. Thus the micro magnetic core memory in accordance with the present invention can be easily integrated to a high degree and can constitute a large-capacity RAM device at a low cost.

In cases where a storage device is produced by integrating the micro magnetic core memory in accordance with the present invention, for example, the magnetic material of a silicon crystal, such as garnet, is appropriate as the material of the magnetic core. Also, as the thin-film sensor for reading the stored information, the GMR or the MR is appropriate. Therefore, mass production of the storage device can be carried out with approximately the same processes as those for the conventional LSI's, and the like.

The micro magnetic core memory in accordance with the present invention has good effects in that it can constitute the storage device having the performance described below.

(1) The inputting and the outputting of information can be carried out quickly.

(2) A high degree of integration can be achieved easily, and a storage device having a large capacity can be produced at a low cost.

(3) The stored information is not lost when the supply of electric power is turned off.

The storage device utilizing the micro magnetic core memory in accordance with the present invention can be used for the same purposes as those of the conventional DRAM's and SRAM's and can also be applied as various kinds of micro chips by the utilization of the characteristics of the storage device.

BRIEF DESCRIPTION OF THE DRAWINGS

FIG. 1 is an enlarged perspective view showing an embodiment of the micro magnetic core memory in accordance with the present invention.

DESCRIPTION OF THE PREFERRED EMBODIMENTS

The present invention will hereinbelow be described in further detail with reference to the accompanying drawings.

Figure 2:
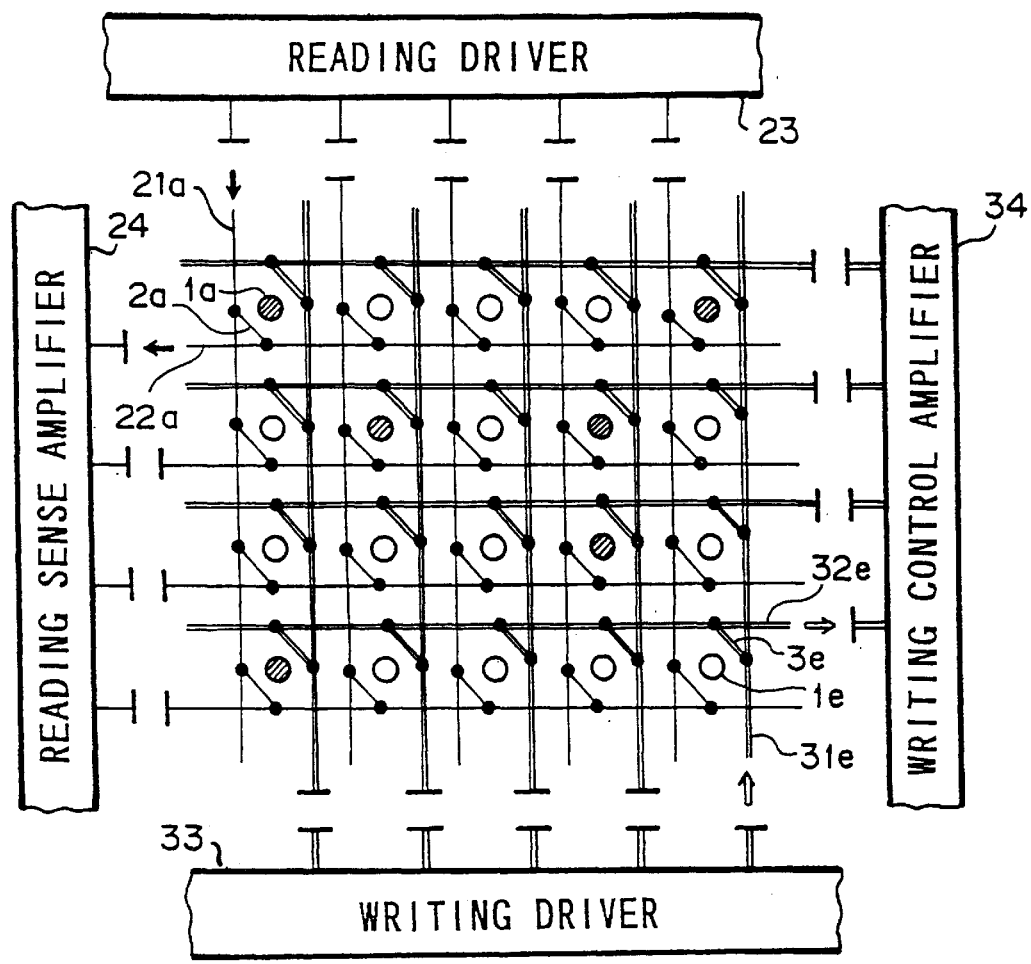
FIG. 2 is an explanatory view showing a constitution of a storage device utilizing the micro magnetic core memory in accordance with the present invention.

FIG. 1 is an enlarged perspective view showing an embodiment of the micro magnetic core memory in accordance with the present invention. FIG. 2 is an explanatory view showing a constitution of a storage device utilizing the micro magnetic core memory in accordance with the present invention.

As illustrated in FIG. 1, an embodiment of the micro magnetic core memory in accordance with the present invention comprises a magnetic core 1 having an approximately cylindrical shape, and a coil 3, which is wound around the outer periphery of the magnetic core 1 and magnetizes the magnetic core 1. The micro magnetic core memory also comprises a writing row line 31 and a writing column line 32, which are connected to the coil 3. The micro magnetic core memory further comprises a sensor 2, which is located in close vicinity to the side of the magnetic core 1 and detects the polarity of magnetization of the magnetic core 1. The micro magnetic core memory still further comprises a reading row line 21 and a reading column line 22, which are connected to the sensor 2. In FIG. 1, reference numerals 25 and 35 represent via-holes for connection.

As illustrated in FIG. 2, the sensor 2 is connected to a reading driver 23 via the reading row line 21 and is connected to a reading sense amplifier 24 via the reading column line 22. In accordance with instructions given from the reading driver 23 and the reading sense amplifier 24, the sensor 2 detects the polarity of magnetization of the magnetic core 1. In cases where a thin-film sensor, which is constituted of a magnetic resistance element, is employed as the sensor 2, it becomes easy to form an integrated circuit. Therefore, a GMR or an MR should preferably be employed as the material for the sensor 2.

As illustrated in FIG. 2, the coil 3 is connected to a writing driver 33 via the writing row line 31 and is connected to a writing control amplifier 34 via the writing column line 32. In accordance with instructions given from the writing driver 33 and the writing control amplifier 34, the coil 3 magnetizes the magnetic core 1. As a result, the polarity of magnetization of the magnetic core 1 is changed.

With the technique for detecting the polarity of magnetization by the magnetic resistance element, which serves as the sensor, and thereby reading the stored information, instead of the reading of the stored information being carried out by the receiving of electric charges as in the DRAM's, the reading of the stored information can be carried out by merely detecting the polarity of magnetization. Therefore, with the storage device utilizing the micro magnetic core memory in accordance with the present invention as the memory cell, the outputting of the stored information can be carried out very quickly, for example, within approximately 10 nanoseconds.

As illustrated in FIG. 2, in the storage device utilizing the micro magnetic core memory in accordance with the present invention, a plurality of magnetic cores 1a~1n are located on a semiconductor substrate 4. Also, sensors 2a~2n and coils 3a~3n are located respectively in close vicinity to the corresponding magnetic cores 1a~1n. Specifically, for example, the sensor 2a and the coil 3a are located in close vicinity to the corresponding magnetic core 1a.

The sensors 2a~2n are connected to the reading driver 23 via the corresponding reading row lines 21a~21n. Also, the sensors 2a~2n are connected to the reading sense amplifier 24 via the corresponding reading column lines 22a~22n. The coils 3a~3n are connected to the writing driver 33 via the corresponding writing row lines 31a~31n. Also, the coils 3a~3n are connected to the writing control amplifier 34 via the corresponding writing column lines 32a~32n.

When the information is to be written into one of the magnetic cores 1a~1n, one of the writing row lines 31a~31n is selected by the writing driver 33, and one of the writing column lines 32a~32n is selected by the writing control amplifier 34. In this manner, one of the magnetic cores 1a~1n is selected, and the information is written into the selected magnetic core. When the stored information is to be read from one of the magnetic cores 1a~1n, one of the reading row lines 21a~21n is selected by the reading driver 23, and one of the reading column lines 22a~22n is selected by the reading sense amplifier 24. In this manner, one of the magnetic cores 1a~1n. In is selected, and the stored information is read from the selected magnetic core.

By way of example, in the writing operation, the writing row line 31e is selected by the writing driver 33, and the writing column line 32e is selected by the writing control amplifier 34. In this manner, the polarity of magnetization of the magnetic core 1a is changed by the coil 3e, and the information is thereby written into the magnetic core 1e.

Also, by way of example, in the reading operation, the reading row line 21a is selected by the reading driver 23, and the reading column line 22a is selected by the reading sense amplifier 24. In this manner, the polarity of magnetization of the magnetic core 1a can be read by the sensor 2a.

Figure 3:
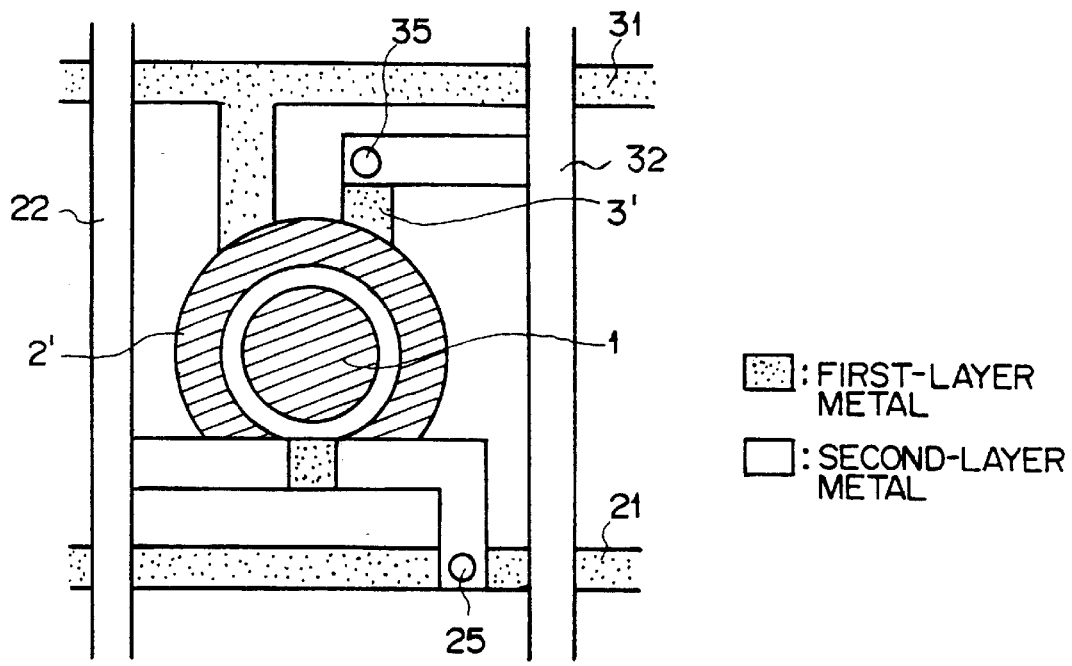
FIG. 3 is a plan view showing a different embodiment of the micro magnetic core memory in accordance with the present invention.
Figure 4:
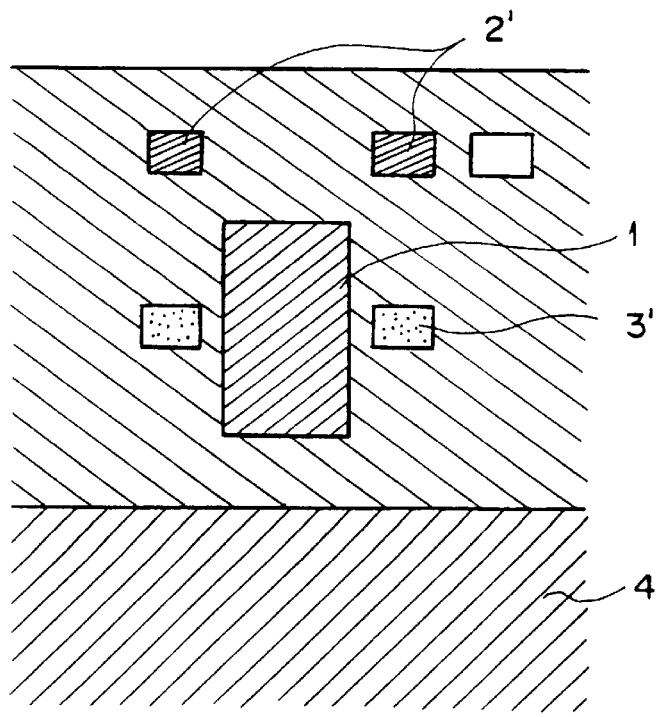
FIG. 4 is a sectional view showing the embodiment of FIG. 3.

FIG. 3 is a plan view showing a different embodiment of the micro magnetic core memory in accordance with the present invention. FIG. 4 is a sectional view showing the embodiment of FIG. 3. In FIG. 3 and FIG. 4 (and those that follow), similar elements are numbered with the same reference numerals with respect to FIG. 1.

Ordinarily, problems are often encountered in that several types of sensors cannot accurately detect the polarity of magnetization. In order for such problems to be eliminated, in the embodiment of FIG. 3, a magnetic bias coil 3', which can apply a magnetic bias, is employed as the coil for magnetizing the magnetic core 1. When information is to be written into the magnetic core 1, the magnetic bias coil 3' magnetizes the magnetic core 1 by applying a bias in a certain direction. As a result, the total amount of magnetization of the magnetic core 1 changes, depending upon the polarity, while the polarity itself, with which the magnetic core 1 is to be magnetized, is not being changed. Specifically, in cases where the direction of the bias coincides with the polarity, with which the magnetic core 1 is to be magnetized, the total amount of magnetization of the magnetic core 1 becomes large. In cases where the direction of the bias is reverse to the polarity, with which the magnetic core 1 is to be magnetized, the total amount of magnetization of the magnetic core 1 becomes small. Therefore, the polarity of magnetization of the magnetic core 1 can be detected accurately. In FIG. 3, reference numeral 2' represents a sensor, such as a GMR.

Figure 5:
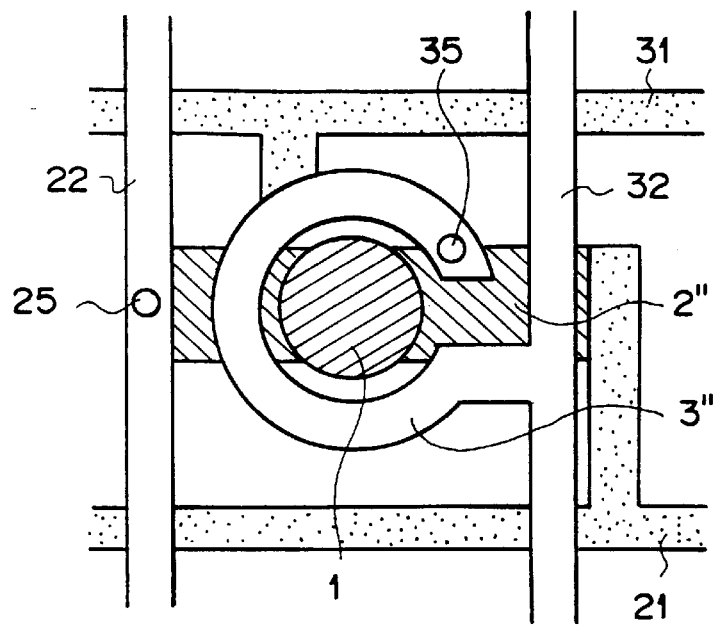
FIG. 5 is a plan view showing a further different embodiment of the micro magnetic core memory in accordance with the present invention.
Figure 6:
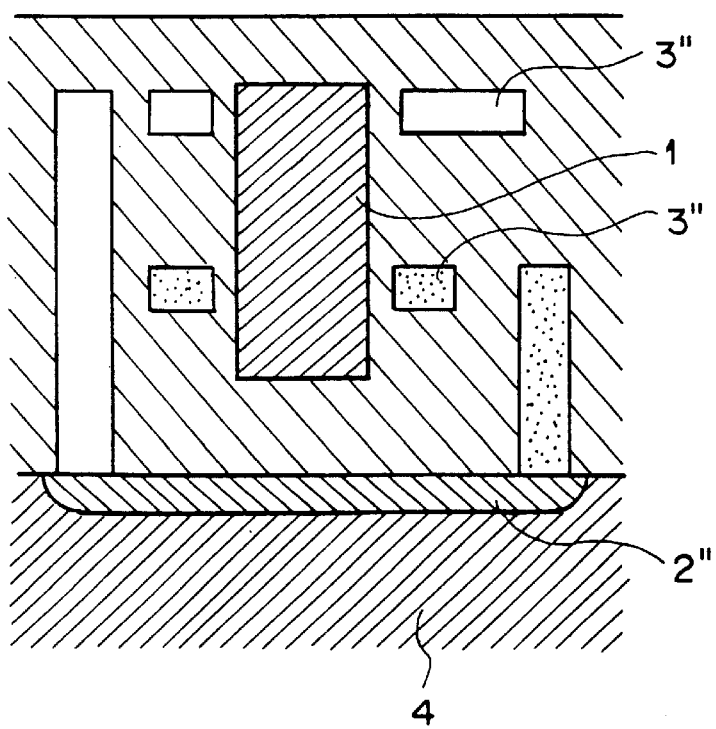
FIG. 6 is a sectional view showing the embodiment of FIG. 5.

FIG. 5 and FIG. 6 show a further different embodiment of the micro magnetic core memory in accordance with the present invention. In this embodiment, a magnetic bias coil 3", which is of the same type as the magnetic bias coil 3' shown in FIG. 3, is employed. Also, asensor 2" constituted of a semiconductor device is employed as the sensor. As illustrated in FIG. 6, the sensor 2" may be located at the lower part of the micro magnetic core memory. The application of the magnetic bias is effective not only when the sensors cannot accurately detect the polarity of magnetization, but also when sensors of low sensitivity are used.

What is claimed is:

1. A micro magnetic core memory, comprising:
   i) a magnetic core, which serves as a storage medium, having a top surface, a bottom surface and a connecting surface extending between said top surface and said bottom surface,
   ii) a coil wound around a periphery of said connecting surface of said magnetic core, said coil being operable to magnetize said magnetic core, and
   iii) a magnetic polarity sensor located in opposition to one of said top surface and said bottom surface of said magnetic core and being operable to detect polarity of magnetization of said magnetic core.

2. A micro magnetic core memory as defined in claim 1 wherein said sensor is a thin-film sensor.

3. A micro magnetic core memory as defined in claim 1 wherein said coil is a magnetic bias coil, which is capable of applying a bias.

4. A method of inputting and outputting information, comprising the steps of:
   i) employing a magnetic core, which is a magnetic material having a top surface, a bottom surface and a connecting surface extending between said top surface and said bottom surface, as a storage medium,
   ii) winding at least one coil around a periphery of said connecting surface of said magnetic core, said coil serving to magnetize said magnetic core,
   iii) magnetizing said magnetic core by said coil, information being thereby written into said magnetic core,
   iv) locating at least one sensor in opposition to one of said top surface and said bottom surface of said magnetic core, said sensor serving to detect polarity of magnetization of said magnetic core, and
   v) detecting the polarity of magnetization of said magnetic core by said sensor, the written information being thereby read from said magnetic core.

5. A method of inputting and outputting information as defined in claim 4 wherein said sensor is a thin-film sensor.

6. A method of inputting and outputting information as defined in claim 4 wherein said coil is a magnetic bias coil, which is capable of applying a bias.

7. The memory of claim 1, wherein said connecting surface is substantially perpendicular to a substrate over which said magnetic core is disposed.

8. The memory of claim 1, wherein said core is approximately cylindrical.

9. The memory of claim 1, wherein a plurality of discreet magnetic cores are disposed on a single substrate.

10. The method of claim 4, further comprising side surface to be substantially perpendicular to a substrate over which said magnetic core is disposed.

11. The method of claim 4, wherein said magnetic core is approximately cylindrical.

12. The method of claim 4, further comprising a plurality of discrete magnetic cores on a single substrate.

* * * * *